United States Patent
Yu et al.

(10) Patent No.: US 10,651,156 B2
(45) Date of Patent: May 12, 2020

(54) MEMORY PACKAGE AND MEMORY DEVICE UTILIZING AN INTERMEDIATE CHIP

(71) Applicant: SAMSUNG ELECTRONICS CO., LTD., Suwon-si, Gyeonggi-do (KR)

(72) Inventors: Hye Seung Yu, Gyeonggi-do (KR); Won Joo Yun, Gyeonggi-do (KR); Hyun Ui Lee, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 37 days.

(21) Appl. No.: 16/150,926

(22) Filed: Oct. 3, 2018

(65) Prior Publication Data
US 2019/0273065 A1    Sep. 5, 2019

(30) Foreign Application Priority Data
Mar. 5, 2018    (KR) .......................... 10-2018-0025778

(51) Int. Cl.
| | | |
|---|---|---|
| H01L 25/065 | (2006.01) | |
| H01L 23/538 | (2006.01) | |
| G11C 5/02 | (2006.01) | |
| G11C 5/06 | (2006.01) | |
| H01L 23/48 | (2006.01) | |

(52) U.S. Cl.
CPC ............ H01L 25/0657 (2013.01); G11C 5/02 (2013.01); H01L 23/481 (2013.01); H01L 23/538 (2013.01); H01L 2224/13025 (2013.01); H01L 2225/06513 (2013.01); H01L 2225/06541 (2013.01)

(58) Field of Classification Search
CPC ................. H01L 23/481; H01L 23/538; H01L 2225/06541; G11C 5/063
See application file for complete search history.

(56) References Cited

U.S. PATENT DOCUMENTS

| | | | |
|---|---|---|---|
| 8,143,719 B2 | 3/2012 | Toh et al. | |
| 8,193,604 B2 | 6/2012 | Lin et al. | |
| 8,816,906 B2 | 8/2014 | Kamgaing et al. | |
| 9,659,628 B2 | 5/2017 | Stephens, Jr. | |
| 9,851,401 B2* | 12/2017 | Kim ........................ | G11C 29/00 |
| 9,953,943 B2* | 4/2018 | Lee .......................... | G11C 5/04 |
| 10,103,158 B2* | 10/2018 | Kanno .................. | G06F 3/0608 |

(Continued)

FOREIGN PATENT DOCUMENTS

| | | |
|---|---|---|
| KR | 10-1109562 | 1/2012 |
| KR | 10-2016-0029392 | 3/2016 |

*Primary Examiner* — Daniel Luke
(74) *Attorney, Agent, or Firm* — F. Chau & Associates, LLC

(57) ABSTRACT

A memory package includes a plurality of memory chips stacked on a package substrate. A logic chip is disposed between the plurality of memory chips and the package substrate. The logic chip is configured to control the plurality of memory chips through a plurality of vias passing through the plurality of memory chips. An intermediate chip is connected to the plurality of vias. The intermediate chip is disposed between the plurality of memory chips and the logic chip, and is configured to select at least a subset of the plurality of vias as a data transmission path between the logic chip and the plurality of memory chips, based on a data transmission rate of the logic chip.

20 Claims, 14 Drawing Sheets

(56) References Cited

U.S. PATENT DOCUMENTS

| | | |
|---|---|---|
| 2010/0174858 A1 | 7/2010 | Chen et al. |
| 2014/0103527 A1 | 4/2014 | Marimuthu et al. |
| 2017/0133103 A1 | 5/2017 | Kwon |
| 2019/0198083 A1* | 6/2019 | Biswas ................ H01L 25/105 |
| 2019/0341370 A1* | 11/2019 | Keeth .................... G11C 5/063 |

* cited by examiner

MEMORY PACKAGE AND MEMORY DEVICE UTILIZING AN INTERMEDIATE CHIP

CROSS-REFERENCE TO RELATED APPLICATION(S)

This application claims the benefit of and priority to Korean Patent Application No. 10-2018-0025778 filed on Mar. 5, 2018 in the Korean intellectual Property Office, the disclosure of which is herein incorporated by reference in its entirety.

TECHNICAL FIELD

The present inventive concept relates to a memory device and, more specifically, to a memory package and a memory device utilizing an intermediate chip.

DISCUSSION OF THE RELATED ART

A memory package may include a plurality of memory chips, that together, store and output data. As technology advances, memory packages have higher capacities and smaller form factors. Such high-capacity memory packages are well suited for modern portable electronic devices. One way in which memory package capacities have been increased is to include a stacked structure of memory chips within each package.

SUMMARY

A memory package includes a plurality of memory chips stacked on a package substrate. A logic chip is disposed between the plurality of memory chips and the package substrate. The logic chip is configured to control the plurality of memory chips through a plurality of vias passing through the plurality of memory chips. An intermediate chip is connected to the plurality of vias. The intermediate chip is disposed between the plurality of memory chips and the logic chip, and is configured to select at least a subset of the plurality of vias as a data transmission path between the logic chip and the plurality of memory chips, based on a data transmission rate of the logic chip.

A memory package includes a plurality of memory chips stacked in a first direction. Each of the plurality of memory chips includes a plurality of vias extending in the first direction. An intermediate chip is disposed below the plurality of memory chips, and includes a driving circuit exchanging data with at least a subset of the plurality of memory chips via the plurality of vias, and a control circuit selectively driving at least a subset of a plurality of transmitters and at least a subset of a plurality of receivers included in the driving circuit, based on a predetermined data transmission rate.

A memory package includes a package substrate. A plurality of memory chips is stacked on a first region of the package substrate. A processor chip is disposed in a second region of the package substrate. A logic chip is disposed between the plurality of memory chips and the package substrate. The logic chip is configured to process a signal received from the processor chip to control the plurality of memory chips to store and/or output data. An intermediate chip is formed in a semiconductor die separate from that of the logic chip. The intermediate chip is disposed between the logic chip and the plurality of memory chips. The intermediate chip includes a receiving circuit serializing data received from the plurality of memory chips and transmitting the serialized data to the logic chip. A transmitting circuit deserializes data to be stored in the plurality of memory chips and transmits the deserialized data to the plurality of memory chips.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Figure 1:
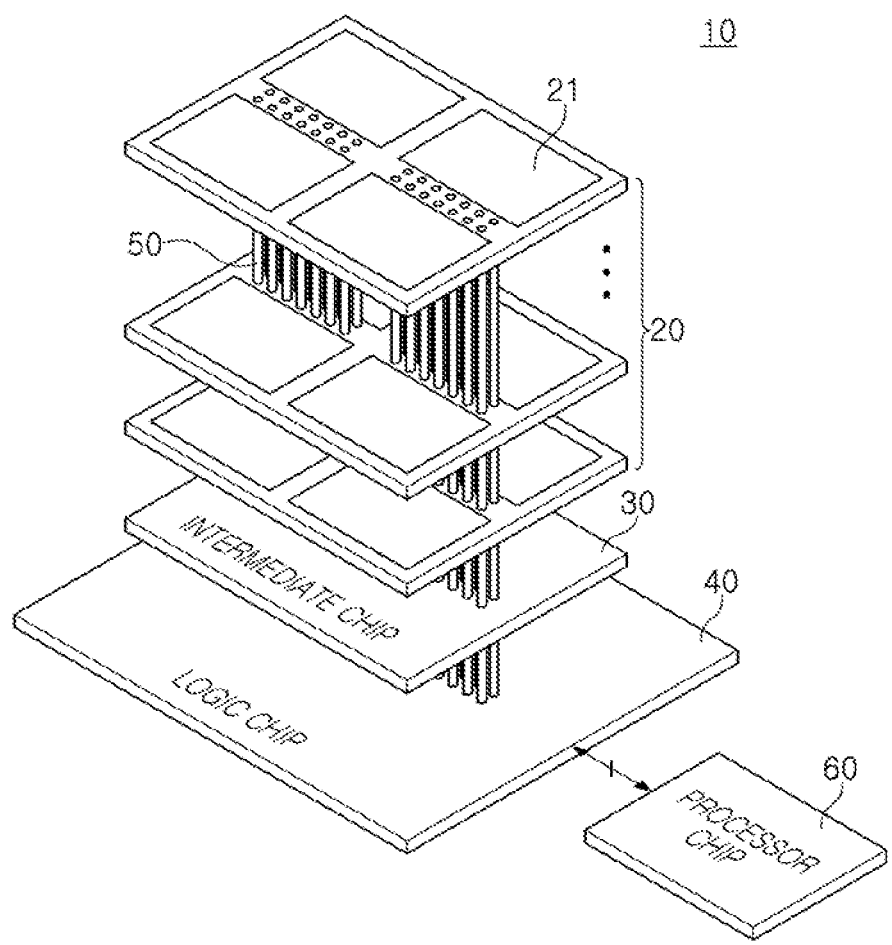
FIGS. 1 and 2 are perspective schematic diagrams illustrating a memory package according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Hereinafter, exemplary embodiments of the present inventive concept will be described with respect to the accompanying drawings.

Figure 2:
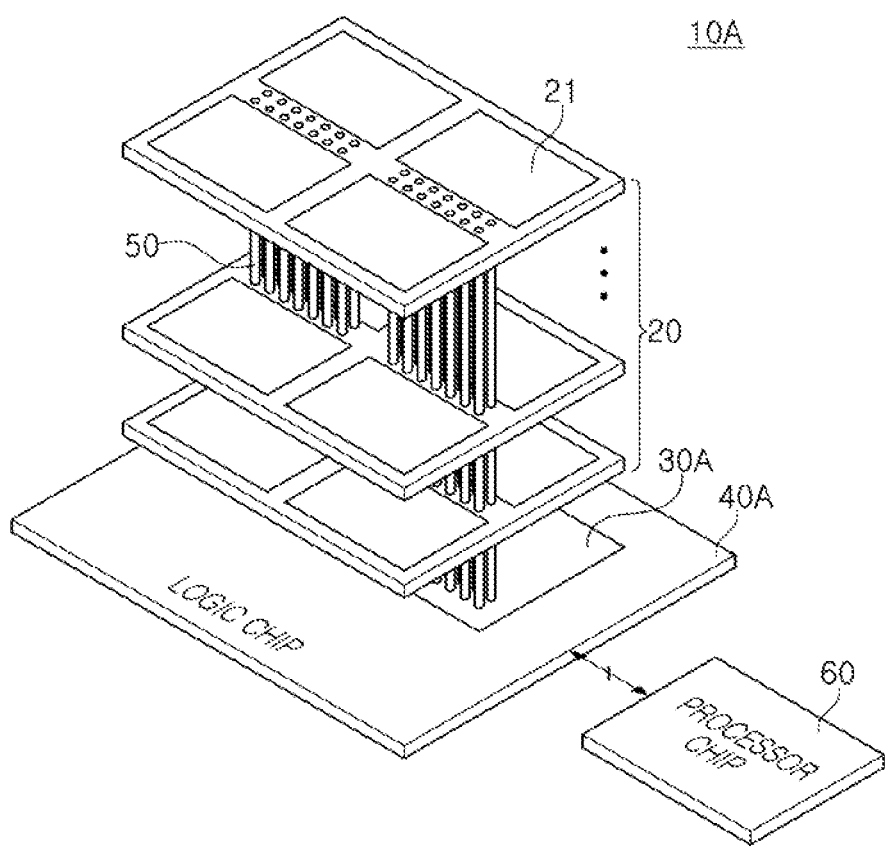

FIGS. 1 and 2 are schematic drawings of memory packages according to exemplary embodiments of the present disclosure.

Referring to FIG. 1, a memory package 10, according to an exemplary embodiment of the present disclosure, may include a plurality of memory chips 20, an intermediate chip 30, a logic chip 40 and the like. The plurality of memory chips 20, the intermediate chip 30, and the logic chip 40 may be connected to each other via a plurality of vias 50.

The plurality of memory chips 20 may be stacked on each other in a vertical direction, and may each include a plurality of memory banks 21. The plurality of memory banks 21 may store and output (e.g. recall) data, and may include a bank array, a row decoder, a column decoder, a sense amplifier, and the like. Although the exemplary embodiment of FIG. 1 illustrates that each of the plurality of memory chips 20 includes four memory banks 21, the number of memory banks 21 may be variously changed depending on the capacity of the respective memory chips 20 and the respective memory banks 21, and the like.

The plurality of memory chips 20 may store or output data, based on an address command, a control command, or the like, transmitted by the logic chip 40. The logic chip 40 may include an interface circuit as a physical region PHY to communicate with an external processor chip 60, a signal processing circuit processing a signal to be transmitted and received with the processor chip 60, and the like. According to an exemplary embodiment of the present disclosure, the logic chip 40 may further include a circuit configured to perform a test and repair function on the memory banks 21 included in the plurality of memory chips 20.

The processor chip 60 may be a central processing unit (CPU), a graphics processing unit (GPU), and/or a system-on-chip (SoC), and the processor chip 60 may be connected to the logic chip 40 to communicate therewith. The processor chip 60 may be mounted on a package substrate, such as the plurality of memory chips 20, the intermediate chip 30 and the logic chip 40. In this respect, the processor chip 60 may be included within the memory package 10. Alternatively, the processor chip 60 may be separated from the memory package 10 and thus may be separately provided. For example, when the memory package 10 is included in the processor chip 60, the processor chip 60 may be located on the same level as the logic chip 40 or may be located below the logic chip 40.

The intermediate chip 30 may be disposed between the plurality of memory chips 20 and the logic chip 40, and may select at least a portion of a plurality of vias 50 as a data transmission path. The intermediate chip 30 may include a transmitting circuit and a receiving circuit, inputting and outputting data through the plurality of vias 50, a control circuit selecting at least a portion of the plurality of vias 50 as a data transmission path, and the like. In an exemplary embodiment of the present disclosure, the intermediate chip 30 may select at least a portion of the plurality of vias as a data transmission path, based on a data transmission rate of the logic chip 40, for example, a burst length and/or bandwidth of the logic chip 40 or the like.

The transmitting circuit may be a circuit transmitting data transmitted by the logic chip 40 to the plurality of memory chips 20. The receiving circuit may be a circuit, receiving data output by the plurality of memory chips 20 and transmitting the data to the logic chip 40. In an exemplary embodiment of the present disclosure, the transmitting circuit may deserialize the data received from the logic chip 40 to output the deserialized data to the plurality of memory chips 20 through the plurality of vias. The receiving circuit may serialize the data received through the plurality of vias and output the serialized data to the logic chip 40. The number of vias 50 connecting the logic chip 40 and the intermediate chip 30 may be less than the number of vias connecting the intermediate chip 30 and the plurality of memory chips 20.

By employing the intermediate chip 30, according to an exemplary embodiment of the present disclosure, the plurality of memory chips 20 might not need to be redesigned to accommodate different data transmission rates of the memory package 10. For example, according to comparative examples, when the plurality of memory chips 20 have a first speed as a maximum operation speed and the memory package 10 has a second speed, slower than the first speed, as a maximum operation speed, for reasons such as power consumption reduction, the plurality of memory chips 20, as well as the logic chip 40, may be redesigned to accommodate the second speed.

According to exemplary embodiments of the present inventive concept, the intermediate chip 30 might only select a portion of the plurality of vias 50 as required, such that a data transmission path between the plurality of memory chips 20 and the logic chip 40 may be set to be suitable for various data transmission rates. Thus, a memory module in which the plurality of memory chips 20 and the intermediate chip 30 are stacked may be applied to the logic chip 40 having various burst lengths and bandwidths and the like, without requiring a design change, and the memory package 10 having various specifications may be efficiently produced.

In an exemplary embodiment of the present disclosure, the number of the plurality of vias 50 may be determined by a maximum data transmission rate of the plurality of memory chips 20. For example, the memory chips 20 may respectively be connected to the vias 50, the number of which is determined depending on the maximum data transmission rate, for example, a bandwidth or the like, and in actual operations, may transmit or receive data through the entirety or a portion of the vias 50, depending on the specification of the memory package 10. Thus, the plurality of memory chips 20, according to an exemplary embodiment of the present disclosure, may also be respectively backward compatible with the logic chip 40, transmitting data at a speed lower than a maximum data transmission rate specified in the specification of the plurality of memory chips 20.

Referring to FIG. 2, a memory package 10A, according to an exemplary embodiment of the present disclosure, may include a plurality of memory chips 20, an intermediate chip 30A, and a logic chip 40A, and the like. Each of the plurality of memory chips 20 may include a plurality of memory banks 21, and the plurality of memory chips 20, the intermediate chip 30 and the logic chip 40 may be connected to one another via a plurality of vias 50.

As illustrated in FIG. 2, the intermediate chip 30A and the logic chip 40A may be located on the same level. In an exemplary embodiment of the present disclosure, the intermediate chip 30A and the logic chip 40A may be provided by different semiconductor dies, and may be mounted on a single interposer substrate. The different semiconductor dies may be connected to each other along the single interposer substrate. In an exemplary embodiment of the present disclosure, the intermediate chip 30A and the logic chip 40A may be connected to each other via wiring provided inside a substrate.

The intermediate chip 30A may be disposed in a first region of the interposer substrate, and the logic chip 40A may be disposed in a second region, different from the first region. In an exemplary embodiment of the present disclosure, the first region be defined by an internal portion of the interposer substrate, and the second region may be defined as a region at least partially surrounding the first region. The logic chip 40A may be disposed on one side of the interposer substrate to efficiently connect the logic chip 40A and the processor chip 60 to each other.

Figure 3:
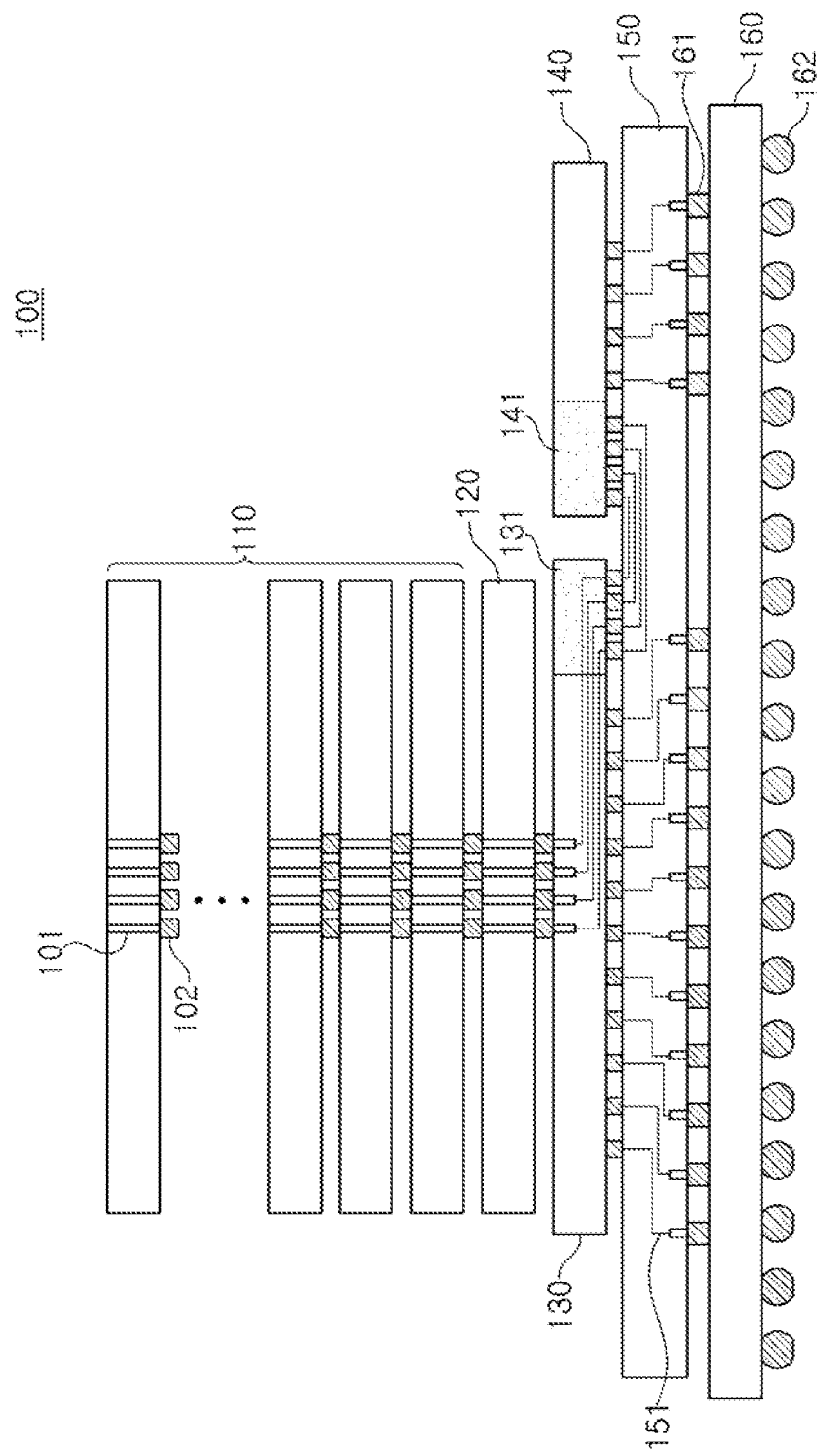
FIG. 3 is a cross-sectional diagram illustrating a structure of a memory package according to an exemplary embodiment of the present inventive concept.

FIG. 3 is a drawing illustrating a structure of a memory package according to an exemplary embodiment of the present disclosure.

Referring to FIG. 3, a memory package 100, according to an exemplary embodiment of the present disclosure, may include a plurality of memory chips 110, an intermediate chip 120, a logic chip 130, a processor chip 140, an interposer substrate 150, a package substrate 160 and the like. The plurality of memory chips 110, the intermediate chip 120 and the logic chip 130 may be connected to one another via a plurality of vias 101 and microbumps 102. In an exemplary embodiment of the present disclosure, the plurality of vias 101 may be provided as through-silicon vias (TSV).

As illustrated in FIG. 3, the logic chip 130 and the processor chip 140 may be disposed above the interposer substrate 150. In a manner different from the approach illustrated in FIG. 3, the processor chip 140 may be mounted on the interposer substrate 150, and the logic chip 130 may also be disposed above the processor chip 140. The microbumps 102 provided on lower portions of the logic chip 130 and the processor chip 140 may be electrically connected to first flip chip bumps 161 on the package substrate 160 through a wiring structure 151 in the interposer substrate 150. Second flip chip bumps 162 may be formed on a lower portion of the package substrate 160, and the memory package 100 may send or receive signals to or from other external packages or semiconductor devices via the second flip chip bumps 162.

An interface circuit 131 of the logic chip 130 and an interface circuit 141 of the processor chip 140 may exchange signals through the wiring structure 151 provided in the interposer substrate 150. The logic chip 130 may perform controlling operations such that the plurality of memory chips 110 input and output data, or may perform functions such as testing the plurality of memory chips 110, and the like. In an exemplary embodiment of the present disclosure, the logic chip 130 may perform the functions by instructions transmitted by the processor chip 140, and may communicate with the plurality of memory chips 110 via the intermediate chip 120.

The intermediate chip 120 may set a data transmission path between the logic chip 130 and the plurality of memory chips 110 in consideration of a data transmission rate required by the memory package 100. For example, the intermediate chip 120 may select at least a portion of the plurality of vias 101 as a data transmission path with reference to a bandwidth or a burst length of the logic chip 130, or the like. To this end, the intermediate chip 120 may include a driving circuit to input/output data through the plurality of vias 101, and a control circuit controlling the driving circuit. In an exemplary embodiment of the present disclosure, the driving circuit may include a plurality of transmitters and a plurality of receivers connected to the plurality of vias 101.

For example, when a maximum data transmission rate of the logic chip 130 is slower than a maximum data transmission rate of the plurality of memory chips 110, the control circuit might only turn on a portion of the plurality of transmitters and the plurality of receivers, and may turn the others off. Thus, only the portion of the vias 101 connected to the turned-on transmitters and receivers may operate as the data transmission path. According to an exemplary embodiment of the present disclosure, when the maximum data transmission rate of the plurality of memory chips 110 is 4 Gbps and the logic chip 130 transmits data at a maximum of 2 Gbps, the intermediate chip 120 may select half of the plurality of vias 101, as the transmission path. For example, the number of the plurality of vias 101 may be determined depending on the maximum data transmission rate of the plurality of memory chips 110.

Figure 4:
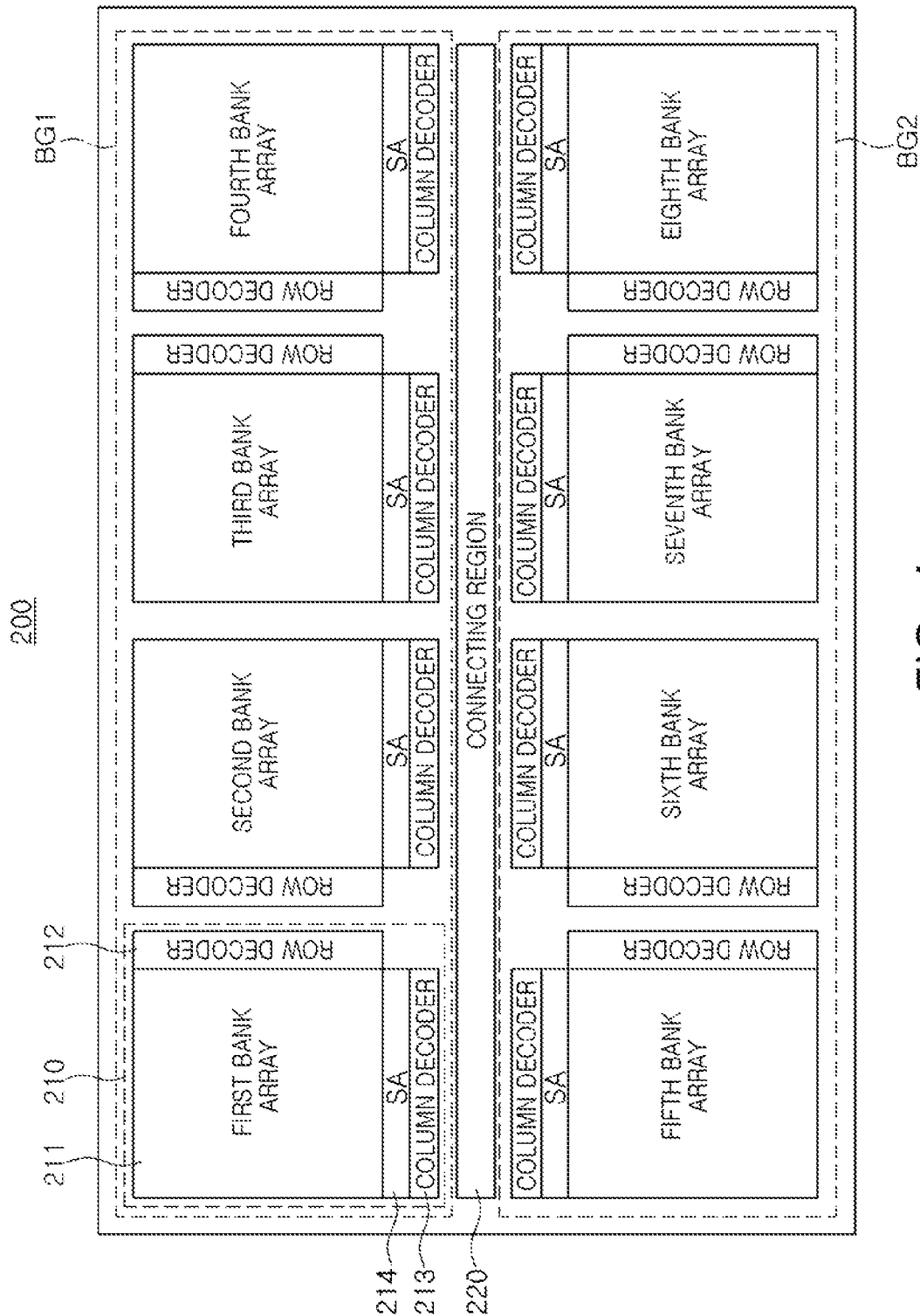
FIG. 4 is a schematic diagram illustrating a structure of a memory chip included in a memory package according to an exemplary embodiment of the present inventive concept.

FIG. 4 is a schematic drawing illustrating a structure of a memory chip included in a memory package according to an exemplary embodiment of the present disclosure.

Referring to FIG. 4, a memory chip 200, according to an exemplary embodiment of the present disclosure, may include a plurality of memory banks 210 and a connection region 220. Each of the plurality of memory banks 210 may include a bank array 211 having a plurality of memory cells, and a row decoder 212, a column decoder 213, a sense amplifier 214, and the. In an exemplary embodiment of the present disclosure, portions of the plurality of memory banks 210 may be grouped. As illustrated in FIG. 4, first to fourth memory banks may be included in a first bank group BG1, and fifth to eighth memory banks may be included in a second bank group BG2.

The plurality of memory banks 210 may input/output data, or may perform a testing operation, a repairing operation or the like, based on a command transmitted through a plurality of vias formed in the connection region 220. In an exemplary embodiment of the present disclosure, the command may include a control command, an address command, and the like. The plurality of vias formed in the connection region 220 may be through-silicon vias, and may be connected to another memory chip, another logic chip, or the like disposed above or below the memory chip 200. The logic chip may generate a control command, an address command or the like, or may receive a control command, an address command or the like from an external processor chip or the like to transmit the commend to the memory chip 200.

The number of the plurality of vias included in the connection region 220 may be determined, based on a maximum data transmission rate of the memory chip 200. In addition, the number of vias actually used as data transmission paths, among the plurality of vias, may be changed, depending on a data transmission rate of the logic chip, transmitting the control command, the address commend and the like to the memory chip 200.

For example, when the data transmission rate of the logic chip is equal to a maximum data transmission rate that may be supported by the memory chip 200, the entirety of the plurality of vias formed in the connection region 220 may be used as data transmission paths. When the data transmission rate of the logic chip is slower than the maximum data transmission rate of the memory chip 200, only a portion of the plurality of vias formed in the connection area 220 may be used as a data transmission path. An operation of selecting the data transmission path among the plurality of vias may be performed, by a separate intermediate chip connected to the plurality of vias, between the memory chip 200 and the logic chip.

Thus, the memory chip 200, according to an exemplary embodiment of the present disclosure, may operate in such a manner that the memory chip 200 is connected to a logic chip having various data rates, for example, various bandwidths, burst lengths or the like, without any design change to the memory chip 200. The number of the plurality of vias formed in the connection region 220 to secure compatibility with the memory chip 200 may be determined by the number of data transmission paths required when the memory chip 200 operates at a maximum data transmission rate. In addition, a driving circuit and a control circuit to input/output data through the plurality of vias may be provided in the intermediate chip connected to the plurality of vias, between the logic chip and the memory chip 200.

Figure 5:
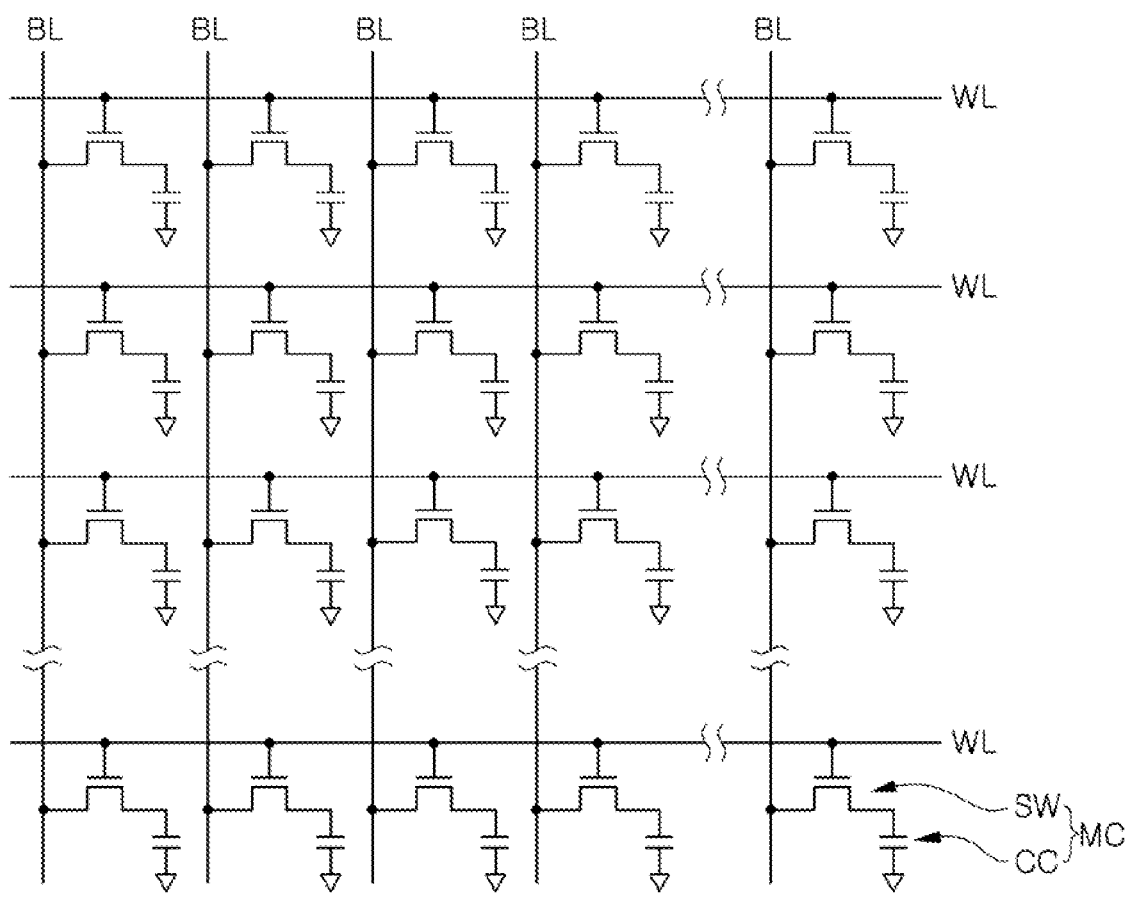
FIG. 5 is a circuit diagram of a bank array included in a memory chip according to an exemplary embodiment of the present inventive concept.

FIG. 5 is a circuit diagram of a hank array included in a memory chip according to an exemplary embodiment of the present disclosure.

Referring to FIG. 5, a bank array, according to an exemplary embodiment of the present disclosure, may include a plurality of memory cells MC. The memory cells MC may be provided at points at which a plurality of word lines WL and a plurality of bit lines BL intersect. Each of the memory cells MC may be connected to a single word line WL and a single bit line BL.

Each of the memory cells MC may include a switching device SW and an information storage capacitor CC. In an exemplary embodiment of the present disclosure, the switching device SW may include a transistor. A gate terminal of the transistor may be connected to the word line WL. Drain and/or source terminals of the transistor may be connected to the bit line BL and the information storage capacitor CC, respectively.

The controller included in the memory chip may charge the information storage capacitor CC included in each of the plurality of memory cells MC, or may discharge the charge stored in the information storage capacitor CC, via the plurality of word lines WL and the plurality of bit lines BL, thereby writing or erasing data. Further, the controller may read data from the plurality of respective memory cells MC by reading a voltage of the information storage capacitor CC and the like. In an exemplary embodiment of the present disclosure, the controller may perform a refreshing operation of rewriting data to the plurality of memory cells MC to prevent the charge charged in the information storage capacitor CC from being naturally discharged and data from being lost.

Figure 6:
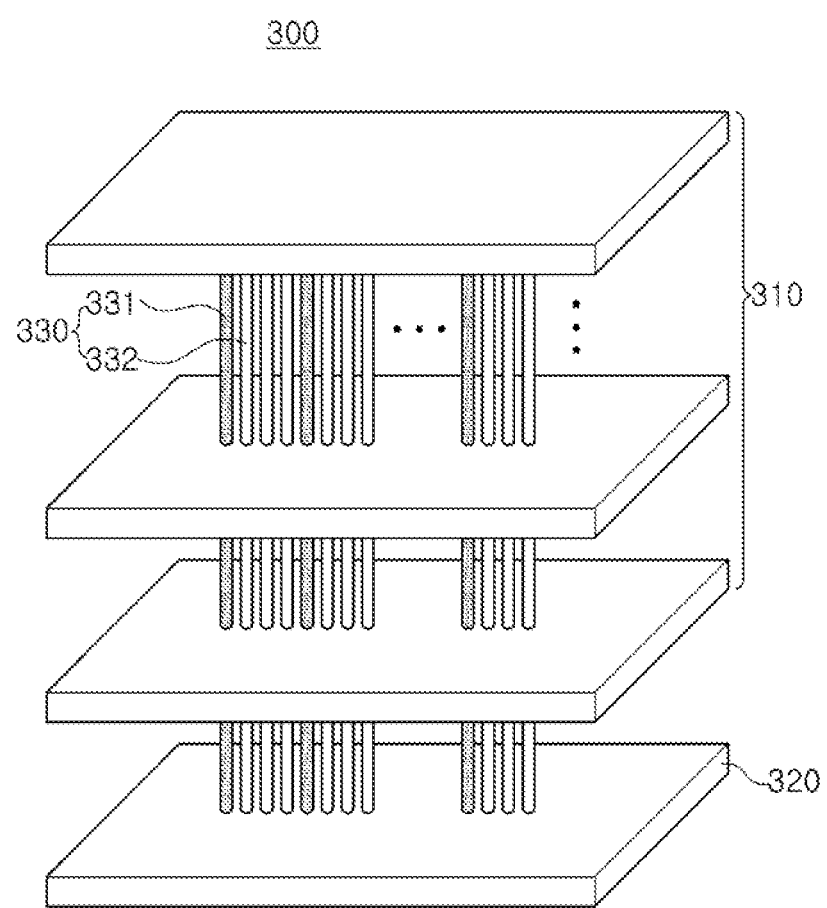
FIGS. 6 to 8 are perspective schematic diagrams illustrating operations of a memory package according to an exemplary embodiment of the present inventive concept.
Figure 7:
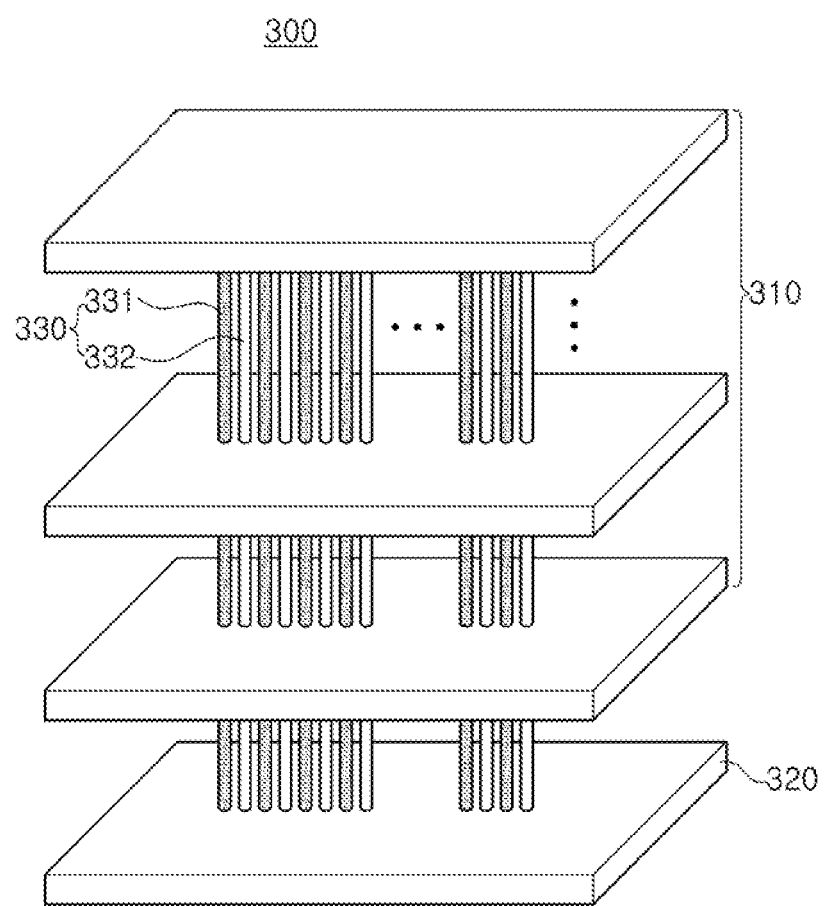
Figure 8:
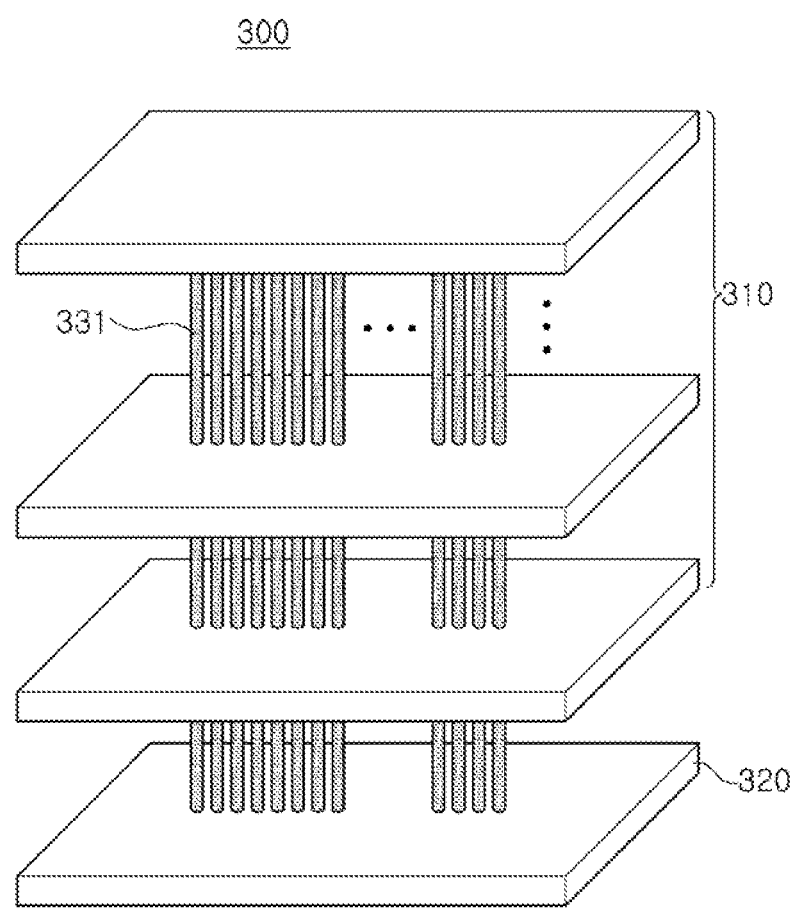

FIGS. 6 to 8 are drawings of operations of a memory package according to an example embodiment.

A memory package 300, as illustrated in FIGS. 6 to 8, may include a plurality of memory chips 310 stacked in a vertical direction, and an intermediate chip 320 disposed below the plurality of memory chips 310. The plurality of memory chips 310 and the intermediate chip 320 may be connected to each other via a plurality of vias 330. In an exemplary embodiment of the present disclosure, the plurality of vias 330 may be disposed adjacent to the center of the plurality of memory chips 310 and the intermediate chip 320.

The intermediate chip 320 may select portions of the plurality of vias 330 as operation vias 331, based on a data transmission rate of the memory package 300. Remaining vias, non-selected as the operation vias 331, may be designated as non-operation vias 332. The intermediate chip 320 may include a driving circuit including a transmitting circuit and a receiving circuit connected to the plurality of vias 330, and a control circuit controlling the driving circuit. The transmitting circuit and the receiving circuit may output data to the plurality of memory chips 310 or receive data output from the plurality of memory chips 310 through the operation vias 331.

The number of the plurality of vias 330 may be determined by the data transmission rate of the plurality of memory chips 310, for example, the bandwidth. Alternatively, the number of operation vias 331 actually used as the data transmission paths, among the plurality of vias 330, may be determined by a bandwidth of a logic chip connected to the intermediate chip 320.

According to an exemplary embodiment of the present disclosure, when the bandwidth of the logic chip is a quarter of the bandwidth of the plurality of memory chips 310, operation vias 331 and non-operation vias 332 may be selected as illustrated in FIG. 6. According to an exemplary embodiment of the present disclosure, when the bandwidth of the logic chip is one-half of the bandwidth of the plurality of memory chips 310, the operation vias 331 and the non-operation vias 332 may be selected as illustrated in FIG. 7. For example, the bandwidths of the logic chip and the plurality of memory chips 310 are the same as each other, the entirety of the plurality of vias may be selected as the operation vias 331 as illustrated in FIG. 8.

The data transmission rate of the memory package 300 may be determined by a specification of a logic chip connected to a lower portion of the intermediate chip 320 and controlling the plurality of memory chips 310. In an exemplary embodiment of the present disclosure, the number of the plurality of vias 330 may be determined in consideration of a maximum data transmission rate of the plurality of memory chips 310, and the intermediate chip 320 may select at least portions of the plurality of vias 330 as operation vias 331, based on the data transmission rate of the logic chip. Thus, in connecting the memory package 300 to logic chips having different specifications, since the plurality of memory chips 310 are not required to be redesigned, productivity of products may be significantly increased.

Figure 9:
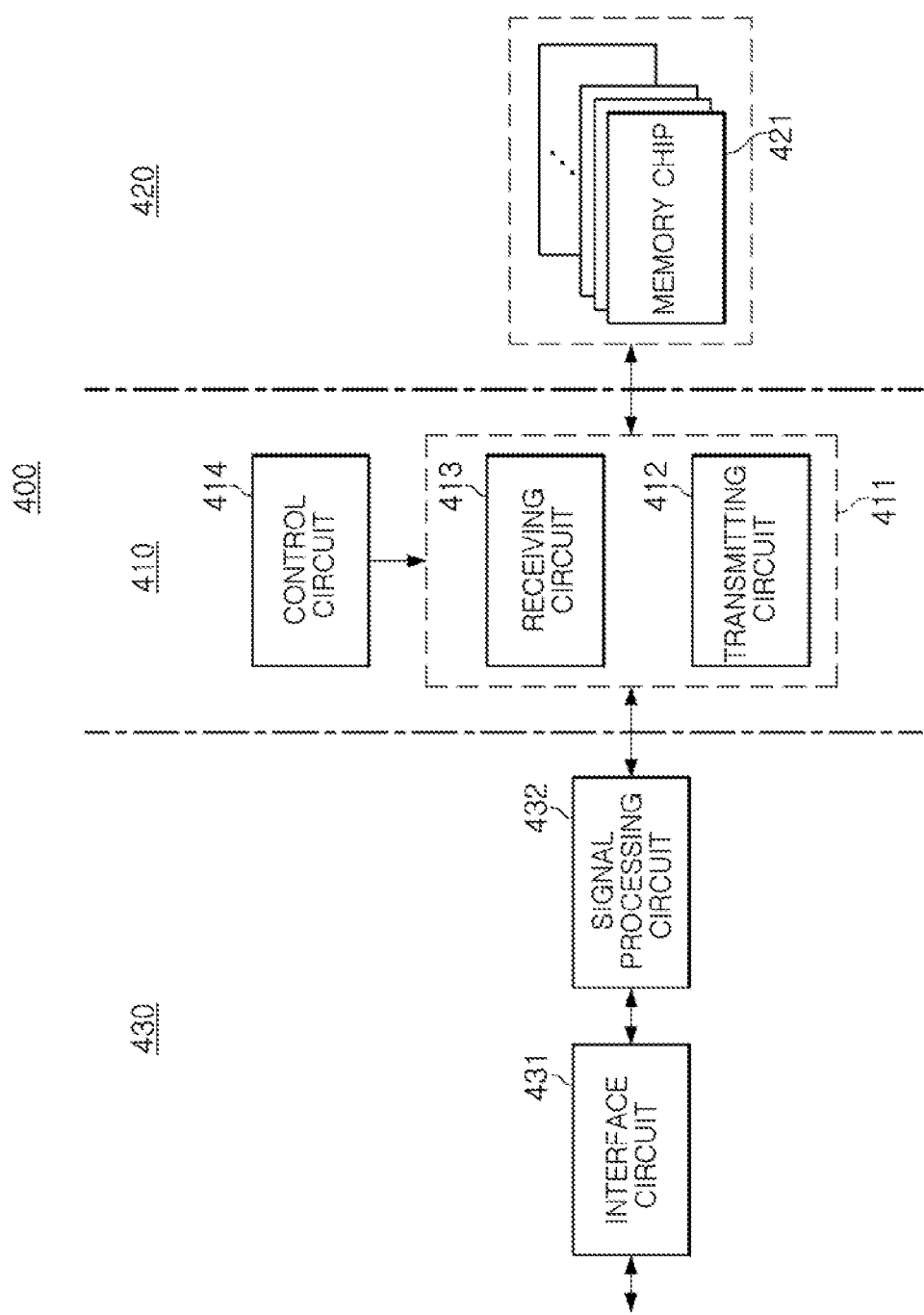
FIG. 9 is a schematic block diagram of a memory package according to an exemplary embodiment of the present inventive concept.

FIG. 9 is a schematic block diagram of a memory package according to an exemplary embodiment of the present disclosure.

Referring to FIG. 9, a memory package 400, according to an exemplary embodiment of the present disclosure, may include an intermediate chip 410, a plurality of memory chips 420, and a logic chip 430. The intermediate chip 410, the plurality of memory chips 420, and the logic chip 430 may be connected to each other via a plurality of vias, and the plurality of vias may be through-silicon vias (TSV). A plurality of microbumps may be provided between the intermediate chip 410, the plurality of memory chips 420, and the logic chip 430. A plurality of vias formed in the different chips 410, 420 and 430 may be connected to each other through the microbumps.

The logic chip 430 may include an interface circuit 431 and a signal processing circuit 432. The interface circuit 431 may include a physical region (PHY) connected to an external processor chip or the like to communicate therewith. The signal processing circuit 432 may process a signal received through the interface circuit 431 to transmit the processed signal to a transmitting circuit 412 of the intermediate chip 410, or may process a signal received from a receiving circuit 413 of the intermediate chip 410 to output the processed signal externally via the interface circuit 431.

The plurality of memory chips 420 may receive data from the transmitting circuit 412 via a plurality of vias to store the received data, or may output data to the receiving circuit 413 via the plurality of vias. The plurality of memory chips 420 may include a plurality of memory chips 421 stacked on each other.

The intermediate chip 410 may include a driving circuit 411 and a control circuit 414. The driving circuit 411 may include the transmitting circuit 412 and the receiving circuit 413. The transmitting circuit 412 may include a deserializer and a plurality of transmitters connected to a plurality of vias. The receiving circuit 413 may include a serializer and a plurality of receivers connected to the plurality of vias. In an exemplary embodiment of the present disclosure, each of the plurality of vias may be connected to an output terminal of one transmitter and an input terminal of one receiver. For example, a single transmitter and a single receiver may share one via, and a signal may thus be bidirectionally transmitted through one via.

The control circuit 414 may selectively turn the plurality of transmitters on or off and may control the plurality of receivers to compensate for a difference between a data transmission rate of the logic chip 430 and a data transmission rate of the plurality of memory chips 420. For example, when the data transmission rate of the logic chip 430 is slower than a maximum data transmission rate of the plurality of memory chips 420, the control circuit 414 may turn off portions of the transmitters and receivers. When the data transmission rate of the logic chip 430 is equal to the maximum data transmission rate of the plurality of memory chips 420, the control circuit 414 may control all of the transmitters and receivers to operate. Thus, the plurality of memory chips 420, according to an exemplary embodiment of the present disclosure, may also operate by being backward compatible with the logic chip 430 that might not support the maximum data transmission rate of the plurality of memory chips 420.

Figure 10:
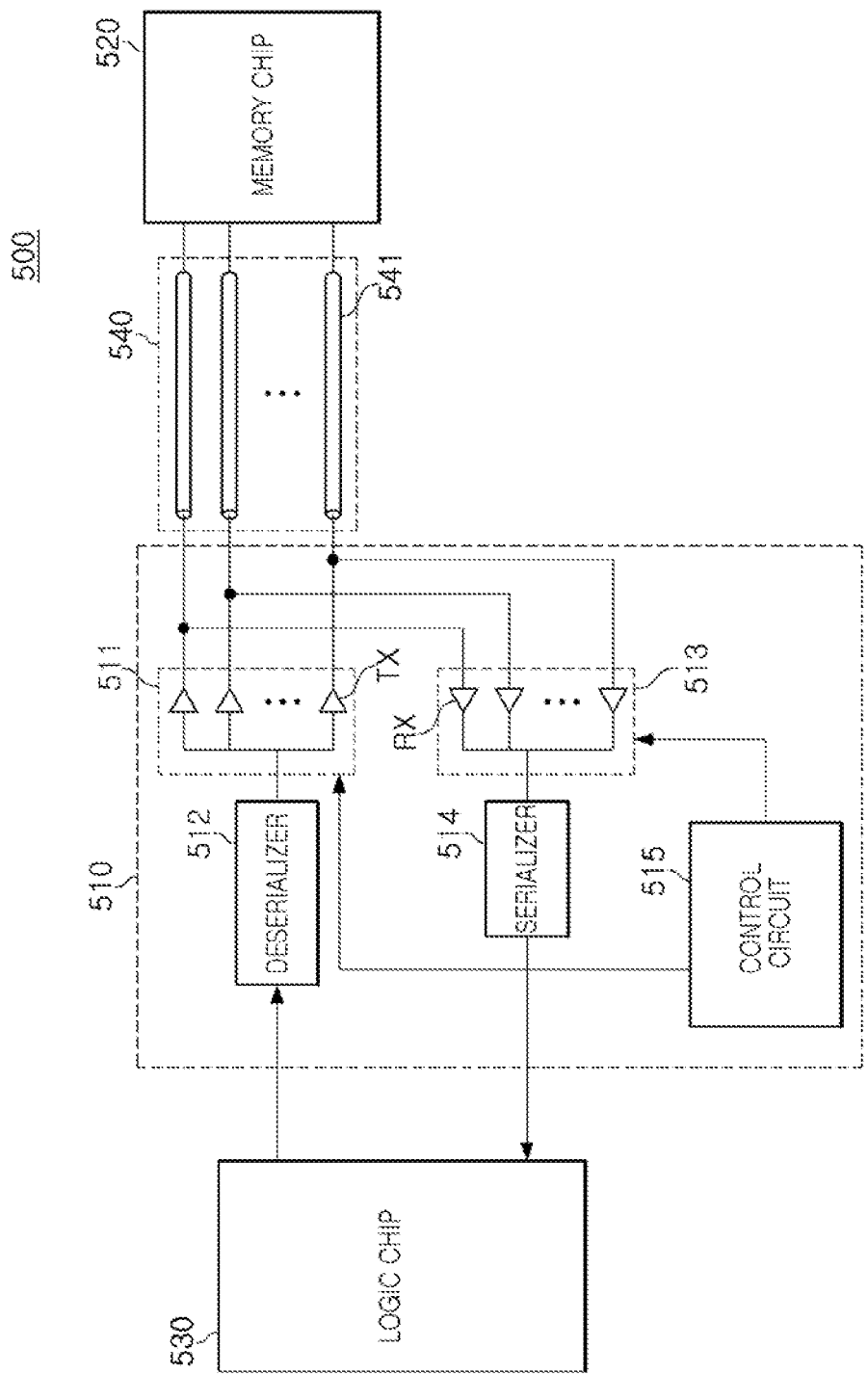
FIG. 10 is a schematic drawing of a memory package according to an exemplary embodiment of the present inventive concept.

FIG. 10 is a schematic drawing of a memory package according to an exemplary embodiment of the present disclosure.

Referring to FIG. 10, a memory package 500, according to an exemplary embodiment of the present disclosure, may include an intermediate chip 510, a memory chip 520, and a logic chip 530. In an exemplary embodiment of the present disclosure, the memory chip 520 may include a plurality of memory chips stacked on each other. The intermediate chip 510 and the memory chip 520 may be connected through a plurality of vias 540, and the plurality of vias 540 may be through-silicon vias (TSV). The intermediate chip 510 and the logic chip 530 may also be connected to each other through a plurality of vias, and the number of the vias connected between the intermediate chip 510 and the logic chip 530 may be less than the number of the vias 540 connected between the intermediate chip 510 and the memory chip 520.

The intermediate chip 510 may perform a function of intermediating data exchanged between the memory chip 520 and the logic chip 530. In an exemplary embodiment of the present disclosure, the memory chip 520 and the logic chip 530 may have different maximum bandwidths from each other, and the intermediate chip 510 may compensate for a difference in bandwidths of the memory chip 520 and the logic chip 530 by selecting a portion of the plurality of vias 540 as a data transmission path, based on the bandwidth of the logic chip 530. Thus, the memory chip 520, according to an exemplary embodiment of the present disclosure, may also be compatible with the logic chip 530 having a relatively narrow bandwidth.

The intermediate chip 510 may include a plurality of transmitters 511, a deserializer 512, a plurality of receivers 513, a serializer 514, a control circuit 515, and the like. Referring to FIG. 10, each of the plurality of vias 540 may be connected to an output terminal of one transmitter Tx and an input terminal of one receiver Rx. For example, one transmitter Tx and one receiver Rx may share a single via 541.

The deserializer 512 may deserialize data received from the logic chip 530 to input the deserialized data to the plurality of respective transmitters 511. The serializer 514 may serialize the data received from the memory chip 520 by the plurality of receivers 513 to output the serialized data to the logic chip 530.

The control circuit 515, in an exemplary embodiment of the present disclosure, may selectively turn the plurality of respective transmitters 511 and the plurality of respective receivers 513 on or off, to set the vias 540 of the number corresponding to a bandwidth of the logic chip 530 to be data transmission paths, which will be described with reference to FIGS. 11 to 13.

Figure 11:
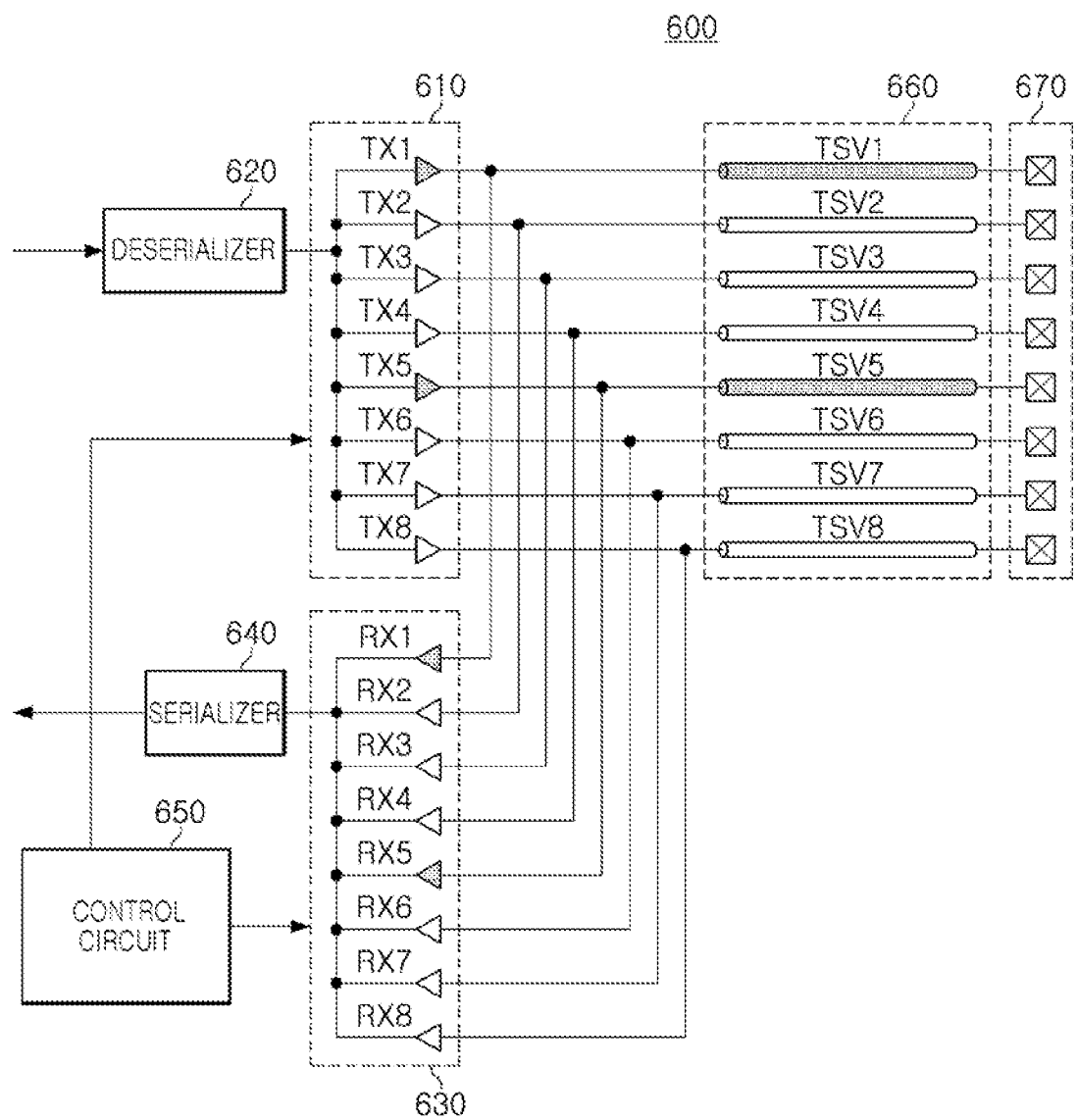
FIGS. 11 to 13 are drawings illustrating operations of a memory package according to an exemplary embodiment of the present inventive concept.
Figure 12:
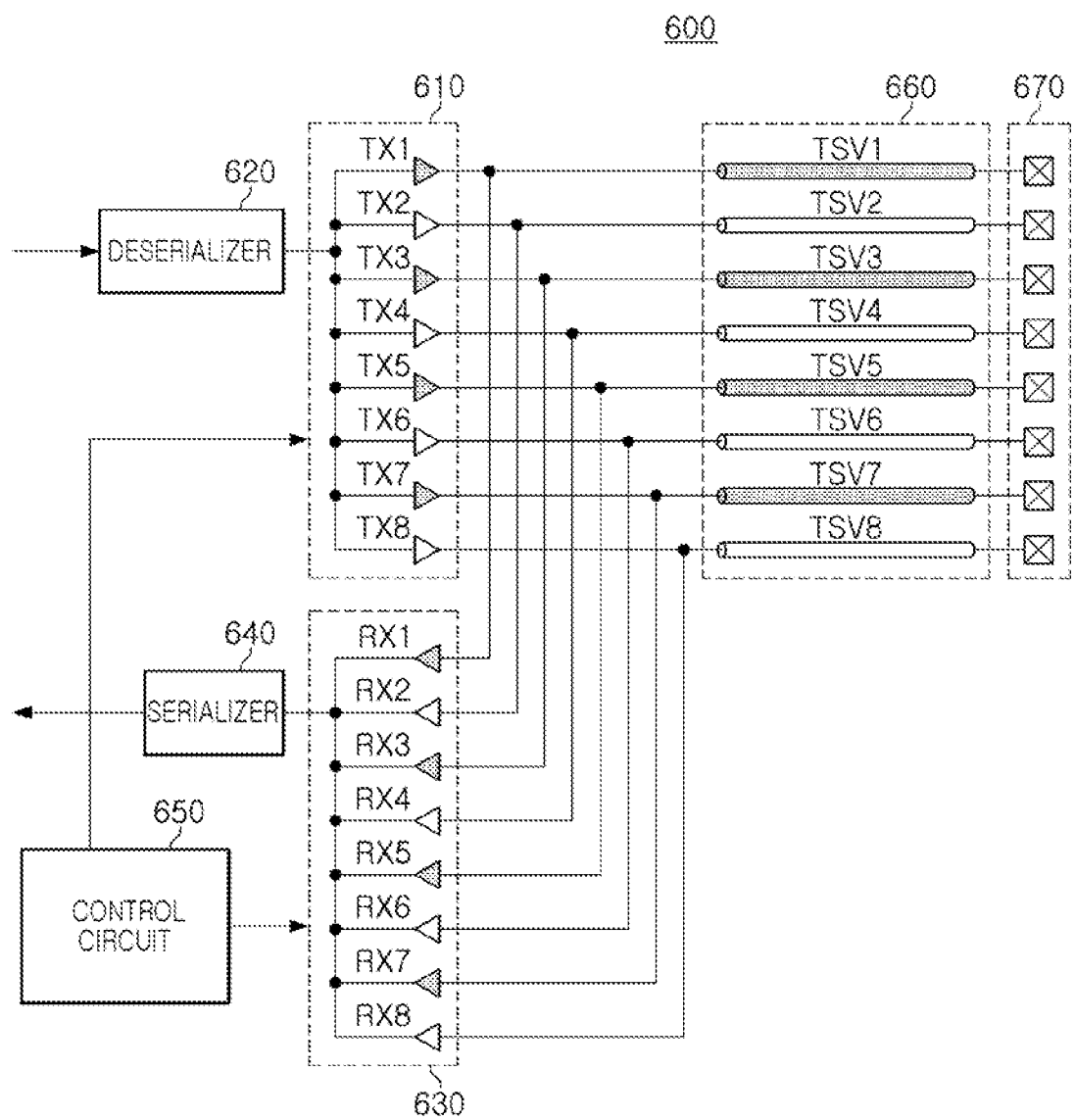
Figure 13:
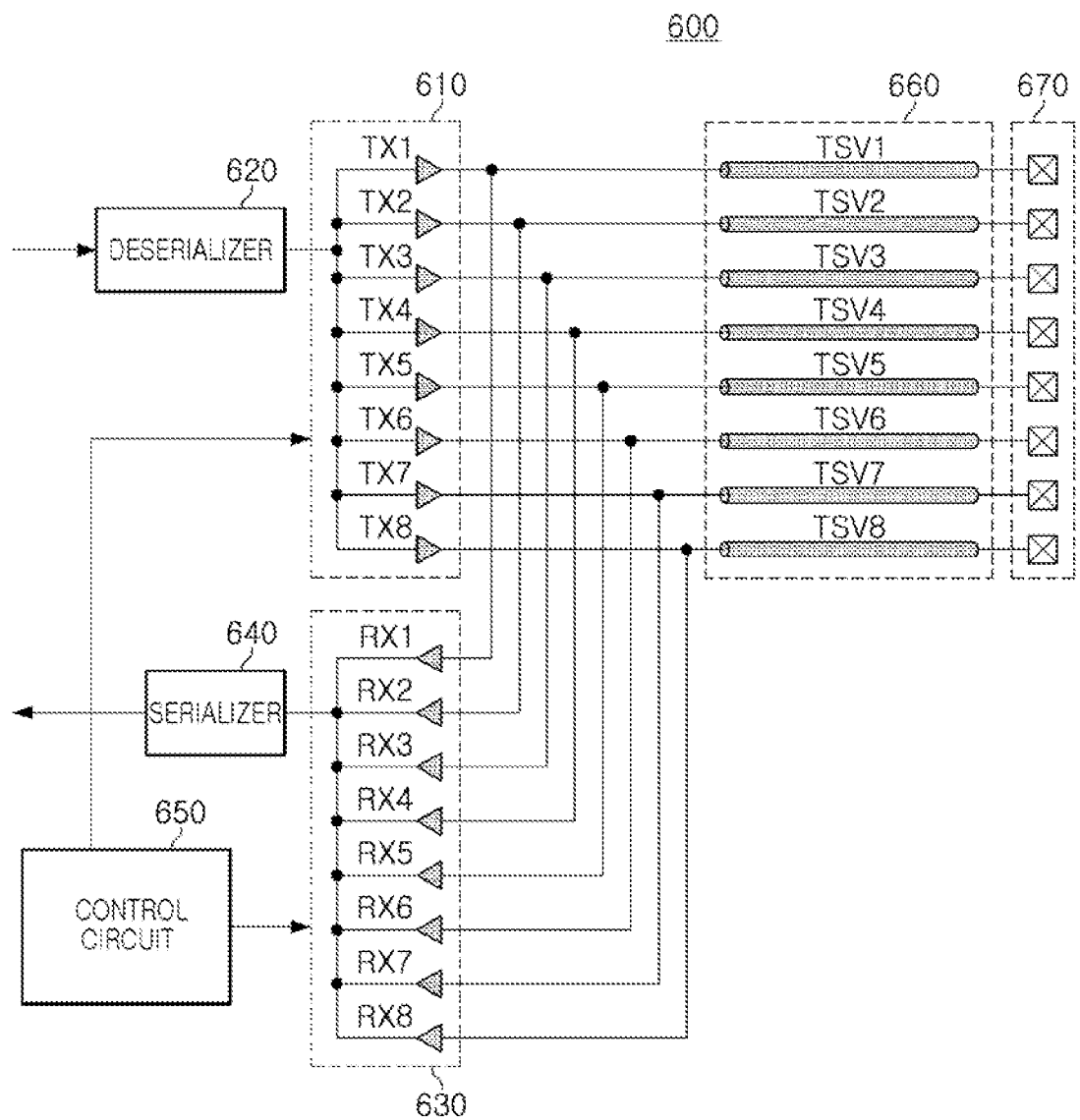

FIGS. 11 to 13 are drawings illustrating operations of a memory package according to an exemplary embodiment of the present disclosure.

Referring to FIGS. 11 to 13, a memory package 600, according to an exemplary embodiment of the present disclosure, may include a plurality of transmitters 610, a deserializer 620, a plurality of receivers 630, a serializer 640, a control circuit 650, and the like. The plurality of transmitters 610 and the plurality of receivers 630 may be connected to pads 670 via a plurality of vias 660. The pads 670 may be data input/output pads provided in memory chips, and the plurality of transmitters 610, the deserializer 620, the plurality of receivers 630, the serializer 640, and the control circuit 650 may be included in one semiconductor die.

The deserializer 620 may deserialize signals received from an external logic chip to input the deserialized signals to the plurality of transmitters 610. The plurality of transmitters 610 may output data via the plurality of vias 660. Data received by the plurality of receivers 630 in parallel through the plurality of vias 660 may be serialized by the serializer 640. The serializer 640 may output the serialized signal to the logic chip.

The plurality of transmitters 610 and the plurality of receivers 630 may be respectively and independently driven by the control circuit 650. As shown in FIG. 11, the control circuit 650 might only turn on first and fifth transmitters TX1 and TX5 and first and fifth receivers RX1 and RX5, and may turn off remaining transmitters and receivers. Thus, only a first via TSV1 and a fifth via TSV5 among the plurality of vias 660 connected to the memory chip may be selected as data transmission paths. FIG. 11 illustrates an example in which a bandwidth of the logic chip connected to the deserializer 620 and the serializer 640 is narrower than a bandwidth of the memory chip including the plurality of pads 670. For example, in the approach illustrated in FIG. 11, the bandwidth of the logic chip may be a quarter of the bandwidth of the memory chip.

Subsequently, referring to FIG. 12, the control circuit 650 may only drive first, third, fifth and seventh transmitters TX1, TX3, TX5 and TX7, and first, third, fifth and seventh receivers RX1, RX3, RX5 and RX7, and may not drive the remaining receivers. Thus, only first, third, fifth and seventh vias TSV1, TSV3, TSV5 and TSV7 may be selected as data transmission paths. The approach illustrated in FIG. 12 may correspond to a case in which the bandwidth of the logic chip is about half of the bandwidth of the memory chip.

FIG. 13 illustrates an example in which the control circuit 650 may drive all of first to eighth transmitters TX1 to TX8 and first to eighth receivers RX1 to RX8. Thus, the entirety of first to eighth vias TSV1 to TSV8 may be selected as data transmission paths. The approach of FIG. 13 may correspond to a case in which the bandwidth of the logic chip is equal to the bandwidth of the memory chip.

As described above with reference to FIGS. 11 to 13, in an exemplary embodiment of the present inventive concept, by using an intermediate chip disposed between the logic chip and the memory chip, the memory chip may also be compatible with a logic chip having a bandwidth smaller than a bandwidth of the memory chip, and may thus operate without the need for customized design. In this case, the number of the vias 660 may be determined, based on the bandwidth of the memory chip, such that the memory chip may also operate by being connected to a logic chip having the same bandwidth as that of the memory chip. FIGS. 11 to 13 illustrate examples in which the numbers of the transmitters 610, the receivers 630, and the vias 660 are respectively eight, for convenience of description, but the present invention is not limited thereto.

For example, when the bandwidth of the memory chip is 4 Gbps, the number of vias connecting the intermediate chip to the memory chip may be determined to be 4096, and the respective number of transmitters and receivers included in the intermediate chip may also be 4096. For example, when the bandwidth of the logic chip is less than a maximum bandwidth of the memory chip, the intermediate chip may only turn on a portion of the transmitters and the receivers. For example, when the bandwidth of the logic chip is 2 Gbps, only 2048 of the transmitters and the receivers included in the intermediate chip may be selectively driven. In addition, when the bandwidth of the logic chip is 1 Gbps, only 1024 of the transmitters and the receivers included in the intermediate chip may be selectively driven.

For example, when the number of vias designed depending on a bandwidth of the memory chip is N, the number of transmitters and receivers included in the intermediate chip may also be N. The intermediate chip may select at least a portion of N vias (e.g., a subset) to set the selected via to be a data transmission path. The number of vias included in the data transmission path may be determined depending on a ratio of the bandwidth of the memory chip to a bandwidth of the logic chip.

Figure 14:
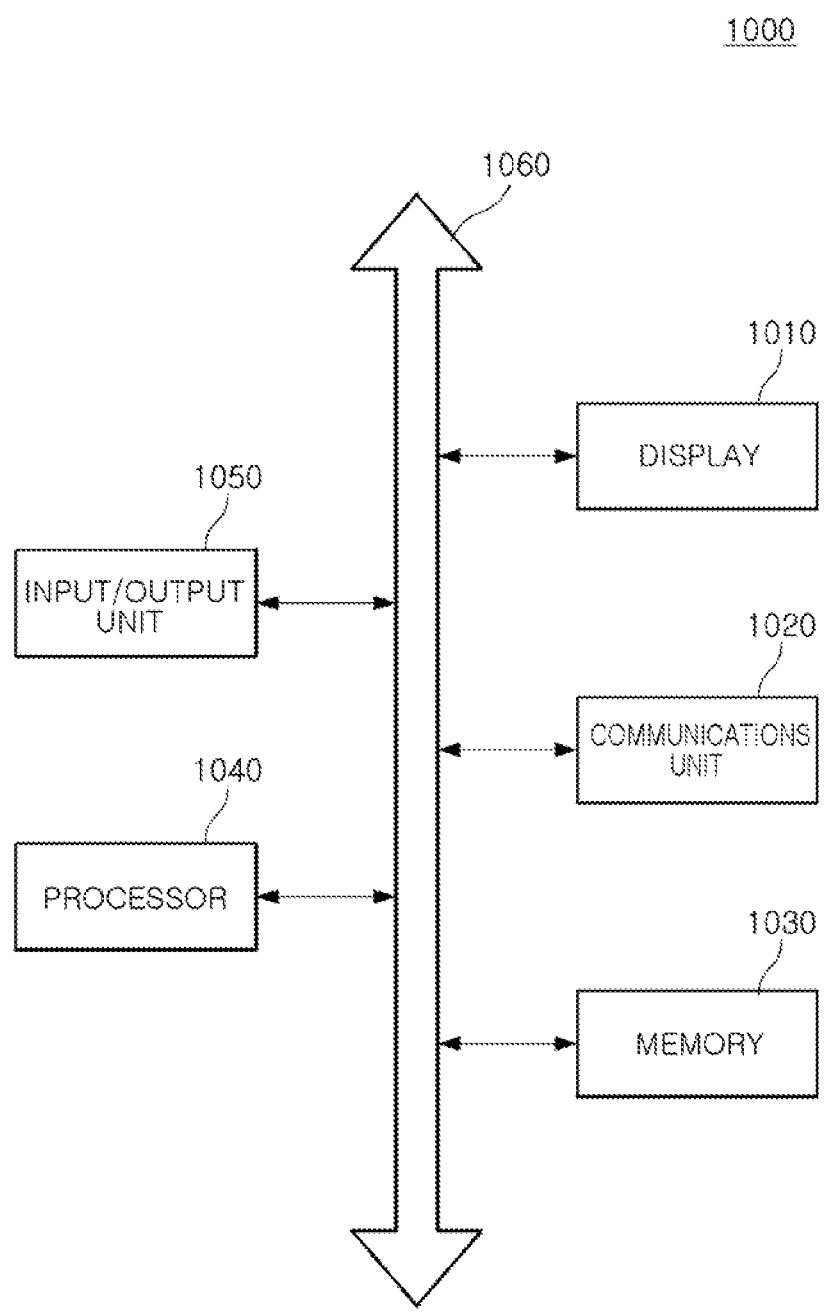
FIG. 14 is a schematic block diagram of an electronic device including a memory package according to an exemplary embodiment of the present inventive concept.

FIG. 14 is a schematic block diagram of an electronic device including a memory package according to an exemplary embodiment of the present disclosure.

An electronic device 1000, according to an exemplary embodiment of the present disclosure illustrated in FIG. 14, may include a display 1010, a communications unit 1020, a memory 1030, a processor 1040, an input/output unit 1050, and the like. Components such as the display 1010, the communications unit 1020, the memory 1030, the processor 1040, the input/output unit 1050 and the like may communicate with each other via a bus 1060. In addition to the components described above, the electronic device 1000 may further include a power supply, a port, and the like.

The processor 1040 may perform specific operations, commands, tasks, and the like. The processor 1040 may be a central processing unit (CPU), a microprocessor unit (MCU), an application processor (AP) or the like, and may communicate with other components such as the display 1010, the communications unit 1020, the memory 1030, the input/output unit 1050 and the like, via the bus 1060.

The memory 1030 included in the electronic device 1000 illustrated in FIG. 14 may include a memory device according to various exemplary embodiments of the present disclosure. In an example, the memory 1030 may be implemented as a memory package according to various exemplary embodiments of the present disclosure described above with reference to FIGS. 1 to 13. The memory 1030 may include a plurality of memory chips stacked on each other, a logic chip transferring a control command and an address command to the plurality of memory chips, an intermediate chip selecting at least a portion of a plurality of vias as a data transmission path, between the logic chip and the plurality of memory chips, and the like. The intermediate chip may selectively turn a plurality of respective transmitters and receivers connected to the plurality of vias on or off, based on a bandwidth of the memory 1030, a burst length, and/or the like, thereby setting a data transmission path suitable for an operating speed.

As set forth above, according to exemplary embodiments of the present disclosure, a plurality of memory chips may be vertically stacked, and an intermediate chip may be connected between a logic chip controlling the plurality of memory chips, and the plurality of memory chips. The intermediate chip may select at least a portion of a plurality of vias connected to the plurality of memory chips, the logic chip and the intermediate chip, as a data transmission path, based on a data transmission rate of the logic chip. Thus, in producing memory packages having various data transmission rates, only a logic chip other than a plurality of memory chips may be redesigned, thereby implementing a memory package and thus improving productivity of a product.

While exemplary embodiments of the present disclosure have been shown and described above, it will be apparent to those skilled in the art that modifications and variations could be made without departing from the scope of the present inventive concept.

What is claimed is:

1. A memory package comprising:
a plurality of memory chips stacked on a package substrate;
a logic chip disposed between the plurality of memory chips and the package substrate, the logic chip configured to control the plurality of memory chips through a plurality of vias passing through the plurality of memory chips; and
an intermediate chip connected to the plurality of vias, the intermediate chip being disposed between the plurality of memory chips and the logic chip, and being configured to select at least a subset of the plurality of vias as a data transmission path between the logic chip and the plurality of memory chips, based on a data transmission rate of the logic chip.

2. The memory package of claim 1, wherein the intermediate chip is configured to select the subset of the plurality of vias as the data transmission path based on a bandwidth of the logic chip.

3. The memory package of claim 2, wherein as the bandwidth of the logic chip increases, the number of vias included within the subset increases.

4. The memory package of claim 1, wherein the intermediate chip comprises:
a driving circuit connected to the plurality of vias and configured to exchange data with the plurality of memory chips; and
a control circuit configured to control the driving circuit to select the subset of the plurality of vias.

5. The memory package of claim 4, wherein the driving circuit comprises:
a deserializer configured to deserialize data received from the logic chip;
a plurality of transmitters configured to transmit data output by the deserializer to at least the subset of the plurality of vias ;
a plurality of receivers configured to receive data the subset of the plurality of vias via the data transmission path; and
a serializer configured to serialize the data received by the plurality of receivers.

6. The memory package of claim 5, wherein the control circuit selectively drives the plurality of transmitters and the plurality of receivers, respectively, to select the subset of the plurality of vias.

7. The memory package of claim 5, wherein each of the plurality of vias is connected to an output terminal of one of the plurality of transmitters and an input terminal of one of the plurality of receivers.

8. The memory package of claim 1, wherein the plurality of vias comprise a plurality of first vias connecting the plurality of memory chips and the intermediate chip to each other, and a plurality of second vias connecting the intermediate chip and the logic chip to each other.

9. The memory package of claim 8, wherein the number of the plurality of second vias is less than or equal to the number of the plurality of first vias.

10. The memory package of claim 1, further comprising a plurality of microbumps connecting the plurality of vias to each other.

11. The memory package of claim 1, further comprising an interposer substrate disposed between the package substrate and the logic chip.

12. The memory package of claim 1, wherein the logic chip comprises an interface circuit connected to an external controller, and a signal processing circuit processing a signal transmitted to and received from the external controller.

13. The memory package of claim 1, wherein each of the plurality of memory chips comprises a plurality of memory banks, and each of the plurality of memory banks comprises a row decoder, a column decoder, and a sense amplifier.

14. The memory package of claim 1, wherein the intermediate chip is disposed below the plurality of memory chips and on an upper portion of the logic chip.

15. The memory package of claim 1, wherein the intermediate chip and the logic chip are formed in different semiconductor dies, and the intermediate chip and the logic chip are mounted on a single interposer substrate and are connected to each other.

16. A memory package comprising:
a plurality of memory chips stacked in a first direction, each of the plurality of memory chips including a plurality of vias extending in the first direction; and
an intermediate chip disposed below the plurality of memory chips, and including a driving circuit exchanging data with at least a subset of the plurality of memory chips via the plurality of vias, and a control circuit selectively driving at least a subset of a plurality of transmitters and at least a subset of a plurality of receivers included in the driving circuit, based on a predetermined data transmission rate.

17. The memory package of claim 16, wherein each of the plurality of vias is connected to one of the plurality of transmitters and one of the plurality of receivers.

18. The memory package of claim 16, wherein the data transmission rate is determined by a logic chip connected to the intermediate chip and controlling the plurality of memory chips to store and/or output data.

19. The memory package of claim 18, wherein the control circuit selectively drives at least a subset of the plurality of transmitters and at least a subset of the plurality of receivers, based on a burst length of the logic chip.

20. A memory package comprising:
a package substrate;
a plurality of memory chips stacked on a first region of the package substrate;
a processor chip disposed in a second region of the package substrate;
a logic chip disposed between the plurality of memory chips and the package substrate, the logic chip being configured to process a signal received from the processor chip to control the plurality of memory chips to store and/or output data; and
an intermediate chip formed in a semiconductor die separate from that of the logic chip, the intermediate chip being disposed between the logic chip and the plurality of memory chips, and including a receiving circuit serializing data received from the plurality of memory chips and transmitting the serialized data to the logic chip, and a transmitting circuit deserializing data to be stored in the plurality of memory chips and transmitting the deserialized data to the plurality of memory chips.

* * * * *